United States Patent
Hsieh et al.

(10) Patent No.: US 9,490,799 B2
(45) Date of Patent: Nov. 8, 2016

(54) ELECTRONIC DEVICE AND OPERATION METHOD THEREOF

(71) Applicant: Synology Incorporated, Taipei (TW)

(72) Inventors: Yen-Li Hsieh, Kaohsiung (TW); Ming-Hung Tsai, New Taipei (TW); Hung-Ming Tsai, Hsinchu County (TW)

(73) Assignee: Synology Incorporated, Taipei (TW)

( * ) Notice: Subject to any disclaimer, the term of this patent is extended or adjusted under 35 U.S.C. 154(b) by 185 days.

(21) Appl. No.: 14/302,403

(22) Filed: Jun. 11, 2014

(65) Prior Publication Data

US 2015/0214944 A1 Jul. 30, 2015

(30) Foreign Application Priority Data

Jan. 29, 2014 (TW) .............................. 103103618 A

(51) Int. Cl.
*H03K 17/687* (2006.01)
*H03K 19/0175* (2006.01)
*G06F 13/40* (2006.01)

(52) U.S. Cl.
CPC ......... *H03K 17/687* (2013.01); *G06F 13/4068* (2013.01); *H03K 19/017509* (2013.01)

(58) Field of Classification Search
CPC ...................................... H03K 17/687–17/693
USPC ....................................................... 327/434
See application file for complete search history.

(56) References Cited

U.S. PATENT DOCUMENTS

| | | | |
|---|---|---|---|
| 5,983,346 A | 11/1999 | Wendell | |
| 6,008,730 A | 12/1999 | Kim et al. | |
| 2009/0019301 A1* | 1/2009 | Minami | G06F 1/3221 713/324 |
| 2011/0316472 A1* | 12/2011 | Han | G06F 13/4068 320/103 |
| 2012/0147511 A1 | 6/2012 | Kim | |
| 2014/0105321 A1* | 4/2014 | Lin | H04L 1/0002 375/295 |

FOREIGN PATENT DOCUMENTS

| | | |
|---|---|---|
| CN | 202033741 U | 11/2011 |
| EP | 2402864 A2 | 1/2012 |
| TW | 200604824 | 2/2006 |

* cited by examiner

*Primary Examiner* — Lincoln Donovan
*Assistant Examiner* — Metasebia Retebo
(74) *Attorney, Agent, or Firm* — CKC & Partners Co., Ltd.

(57) ABSTRACT

An electronic device includes a transmission interface, a switch unit and a control unit. The transmission interface includes a signal reference contact and a signal transmission contact. The switch unit is coupled between the signal reference contact and a grounded layer. The control unit is coupled to the switch unit. When the control unit controls the switch unit to connect the signal reference contact and the grounded layer, the signal transmission contact is used to transmit a first signal. When the control unit controls the switch unit to disconnect the signal reference contact from the grounded layer, the signal reference contact is used to transmit a second signal.

14 Claims, 6 Drawing Sheets

ELECTRONIC DEVICE AND OPERATION METHOD THEREOF

RELATED APPLICATIONS

This application claims priority to Taiwanese Application Serial Number 103103618, filed Jan. 29, 2014, which is herein incorporated by reference.

BACKGROUND

1. Field of Invention

The present disclosure generally relates to an electronic device, in particular, to an electronic device and an operation method which transmits an on signal through a transmission cable.

2. Description of Related Art

Information exchange between electronic devices continues to use more and more throughput, thus, as technology evolves, the storage or memory of an electronic device needs to increase accordingly. If the electronic device is short of enough storage capacity, an external hard disk drive (HDD) expansion device may otherwise be used to expand this storage capacity.

The external HDD expansion device may enter into a standby mode to reduce the power consumption in an unused state. When the HDD expansion device needs to be switched into an on mode, the electronic device can deliver an on signal to the HDD expansion device through a transmission cable, so that the HDD expansion device can proceed a series of starting up processes according to the on signal.

Typically, the on signal is transmitted upon a high-speed transmission line inside a transmission cable. Nevertheless, the on signal is a kind of low-speed signal. A high-speed transmission line is designed for transmitting a high-speed signal. To be more clear, impedance matching should be considered while designing the appropriate high-speed transmission line, which may cause the manufacturing cost to be undesirably raised. Therefore, there may be significant waste in using a high-speed transmission line to transmit a low-speed signal.

SUMMARY

According to an embodiment of the present disclosure, an electronic device is provided. The electronic device includes a transmission interface, a switch unit and a control unit. The transmission interface includes a signal reference contact and a signal transmission contact. The switch unit is coupled between the signal reference contact and a ground layer. The control unit is coupled to the switch unit, in which when the control unit controls the switch unit to connect the signal reference contact to the ground layer, the signal transmission contact is used to transmit a first signal, and when the control unit controls the switch unit to disconnect the signal reference contact from the ground layer, the signal reference contact is used to transmit a second signal.

According to another embodiment of the present disclosure, an operation method of an electronic device is provided. The electronic device includes a transmission interface, which includes a signal reference contact and a signal transmission contact. The operation method includes connecting the signal reference contact to a ground layer, using the signal transmission contact to transmit a first signal, disconnecting the signal reference contact from the ground layer, and using the signal reference contact to transmit a second signal.

As discussed above, according to one or more embodiments of the present disclosure, the electronic device can use a signal transmission contact to transmit a first signal or use a signal reference contact to transmit a second signal (such as a low-speed signal). Accordingly, there is no need to customize additional high-speed wire inside a transmission cable to transmit the second signal, so to the problem of using high-speed transmission line to transmit a low-speed signal is avoided.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
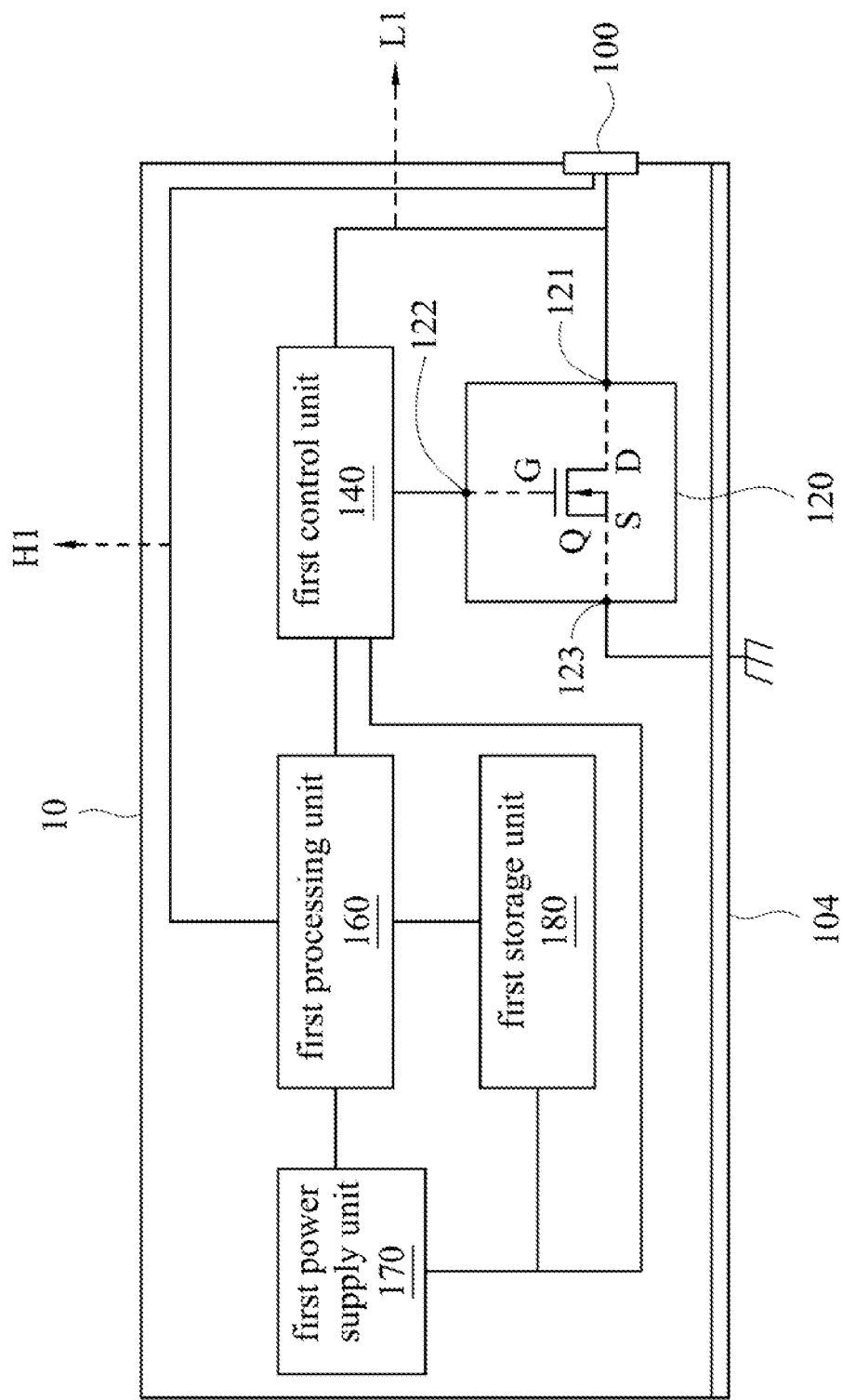
FIG. 1 illustrates a circuit block of an electronic device in accordance with an embodiment of the disclosure.

The following embodiments are disclosed with accompanying diagrams for detailed description. For illustration clarity, many details of this practice are explained in the following descriptions. However, it should be understood that the details of this practice do not intend to limit the present invention. That is, the details of this practice are not necessary in parts of the embodiments of the present invention. Furthermore, for simplifying the drawings, some of the conventional structures and elements are shown with schematic illustrations. Wherever possible, the same reference numbers are used in the drawings and the description to refer to the same or like parts.

An electronic device and an operation method of the electronic device are disclosed in the following embodiments. In more detail, in the following embodiments, the electronic device and the operation method thereof can transmit or receive an on signal through a "signal reference layer" inside a transmission cable. Thus, the transmission cable connected to the electronic device is not need to customize an additional high-speed transmission line to transmit a low-speed on signal, so as to avoid wasting of manufacturing a customized transmission line.

Furthermore, in some embodiments, the electronic device has a standby function and the electronic device can selectively enter a standby mode or an on mode. In the standby mode, a machine state can be held in RAM, and the electronic device cuts power to unneeded subsystem and places RAM into a minimum power state, just sufficient to retain its data. When the electronic device is in the standby mode, it can receive an on signal to recover into the on mode. In the on mode, the electronic device is fully powered on and can be response to a user's input immediately. In practical use, the standby mode may have gone by various names, such as sleep mode, suspend mode or low-power mode; similarly, the on mode may also be named as a high-power mode, a start mode or an operational mode and the on signal may be named as a wake-up signal or a start signal. In some embodiments, when in the standby mode, a signal transmission contact of a transmission interface does not need to receive the on signal from a high-speed transmission line, and thus the electronic device can reduce its power consumption. In more detail, the signal transmission contact is generally used to transmit a high-speed signal, so it needs to be controlled by some complicated logical control modules. If a device uses a signal transmission contact to receive an on signal in the standby mode, many complicated logical control modules need to be active all the time, which would make the device consume too much power in the standby mode and which would not be in compliance with the EUP 2.0 specification regulated by European Union. That is, while in the standby mode, power consumption of an electronic device needs to be less than 0.5 watts.

Detailed speaking, in some embodiments, the electronic device in the standby mode may use a signal reference contact to receive an on signal. Then, the electronic device can use a relative simple control logic or circuit that coupled to the signal reference contact to identify this on signal and to drive a power supply unit to supply power to a processing unit and a memory unit, so as to turn the electronic device from the standby mode into the on mode. Accordingly, in some embodiments, the electronic device does not need to supply power to many complicated logic control modules in the standby mode, but merely needs to supply power to some relative simple control logic or circuit, so as to reduce the power consumption in the standby mode to comply with the EUP 2.0 regulation.

The following embodiments disclose an electronic device that is capable of using a signal reference contact of a transmission interface to transmit or receive a signal. Further, the electronic device can transmit or receive a signal through a signal reference layer inside the transmission cable. Please refer to FIG. 1, which illustrates a circuit block of an electronic device in accordance with an embodiment. The electronic device 10 can be a computer, a network attached storage (NAS) server, but is not limited thereto. As shown in FIG. 1, the electronic device 10 includes a first transmission interface 100, a first switch unit 120, a first control unit 140, a first processing unit 160, a first power supply unit 170, and a first storage unit 180.

The first storage unit 180 is used to store various source codes, data and files. The first storage unit 180 may be composed of any volatile media or non-volatile random-access media. For instance, the first storage unit 180 may be volatile media, a solid-state drive (SSD), a hard disk, flash memory or a combination thereof, but is not limited thereto.

The first power supply unit 170 is used to provide power to the first control unit 140, the first processing unit 160 and the first storage unit 180 for maintaining the operation of the electronic device. The first power supply unit 170 can be a power supply or a battery, but is not limited thereto.

The first processing unit 160 is coupled to the first transmission interface 100, a first control unit 140 and a first storage unit 180. The first processing unit 160 may be a central processing unit (CPU) or a microprocessor, but is not limited thereto. The first processing unit 160 is used to read the source codes stored in the first storage unit 180 and to execute a relative function of the source codes.

Figure 2:
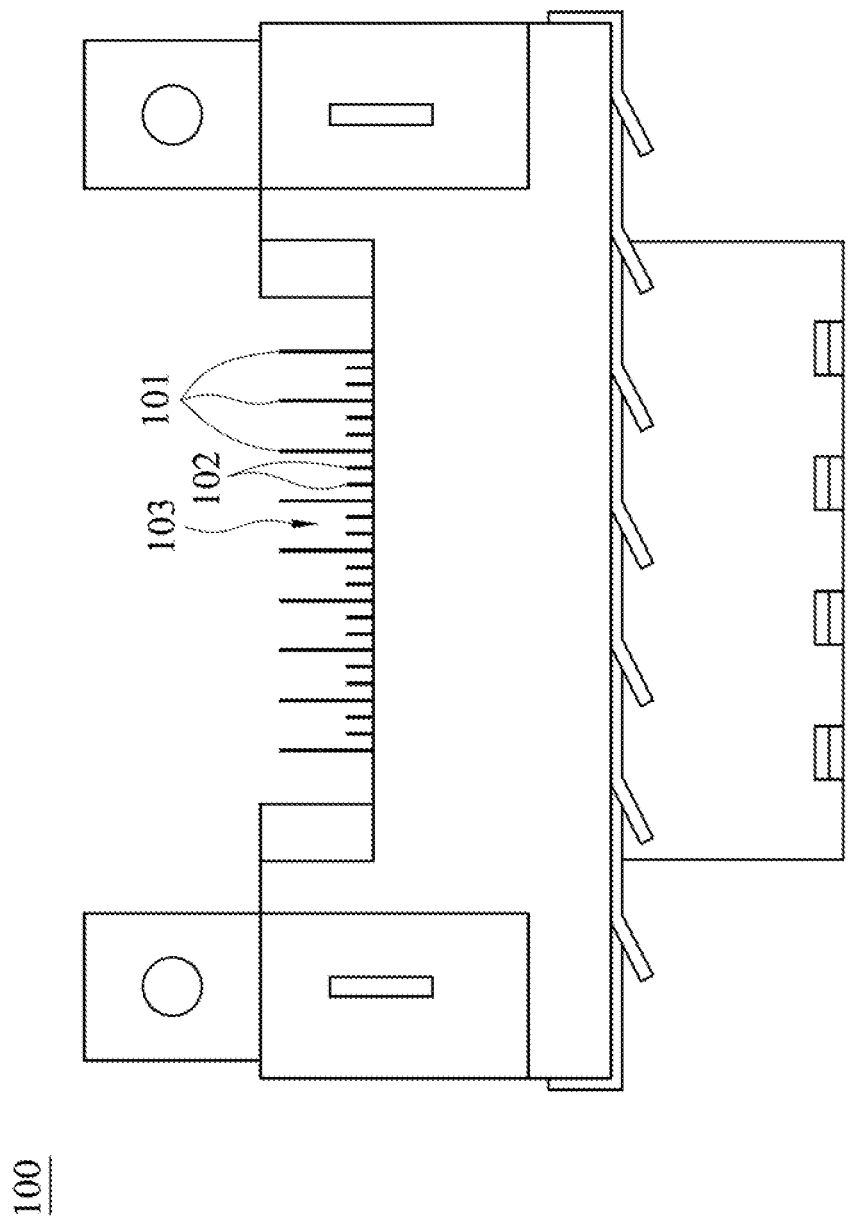
FIG. 2 illustrates a front view of contacts array of the first transmission interface in accordance with an embodiment of the disclosure.

The first transmission interface 100 can be a connecting port used to transmit a high-speed signal. For instance, the first transmission interface 100 can be a connecting port for connecting a CX4 cable line, but is not limited thereto. In another embodiment, the first transmission interface 100 can be a universal series bus (USB) 3.0 connecting port. Please refer to FIG. 1 and FIG. 2, in which FIG. 2 illustrates a front view of contacts array of the first transmission interface 100. Taking the first transmission interface 100 as a connecting port for connecting the CX4 cable line for example, the first transmission interface 100 shown in FIG. 2 includes a plurality of first signal reference contacts 101 and a plurality of first signal transmission contacts 102, in which every two of signal transmission contacts 102 constitute one set of first signal differential pair 103 for transmitting a high-speed signal. One first signal reference contact 101 is disposed between two sets of neighboring first differential pairs 103, so as to avoid across talking between the first differential pairs 103.

Then, the electronic device 10 of the present embodiment will be described in detail with reference made to FIG. 1 and FIG. 2 to show that how to selectively transmit a first signal H1 via the first signal transmission contact 102 or to transmit a second signal L1 via the signal reference contact 101. The first switch unit 120 is coupled to the first signal reference contact 101 of the first transmission interface 100 and a first ground layer 104. The first switch unit 120 is used to selectively connect or disconnect the first signal reference contact 101 and the first ground layer 104. In the present embodiment, the first ground layer 104 can be a metal shell of the electronic device 10. The metal shell can be connected to the earth. When the first signal reference contact 101 and the first ground layer 104 is connected together, the voltage potential of the first signal reference contact 101 is approximately equal to zero, but is not limited thereto. In other embodiments, the first ground layer 104 may represent another reference potential. In this case, when the first signal reference contact 101 and the first ground layer 104 is connected together, the voltage potential of the first signal reference contact 101 is approximately equal to that reference potential.

The first control circuit 140 may be a logic circuit or a complex programmable logic device (CPLD), but is not limited thereto. The first control unit 140 is coupled to the first switch unit 120 and is capable of controlling the first switch unit 120 to selectively connect or disconnect the first signal reference contact 101 and the first ground layer 104. When the first control unit 140 controls the first switch unit 120 to connect the first signal reference contact 101 and the first ground layer 104, a voltage potential of the first signal reference contact 101 is approximately to zero, but is not limited thereto. As a result, the first signal transmission contacts 102 can be used to transmit the first signal H1, and the first signal reference contacts 101 can be used to reduce the cross talk between the first signal transmission contacts 102 and to receive a return current from the first signal H1. When the first control unit 140 controls the first switch unit 120 to disconnect the first signal reference contact 101 from the first ground layer 104, the first control unit 140 raises a potential of the first signal reference contact 101 to a predetermined potential. In other words, the first control unit 140 can raise the potential of the first signal reference contact 101 to a relatively high-level state, in which the first control unit 140 may directly raise the potential of the first signal reference contact 101 or control other electrical components to raise the potential of the first signal reference contact 101. As a result, the first signal reference contact 101 can be used to transmit the second signal L1. According to a changing example of the present embodiment, a transmission frequency of the second signal L1 is less than a transmission frequency of the first signal H1. For instance, the first signal H1 may be a high-speed signal, and the second signal L1 may be a low-speed signal. That is, the first signal transmission contact 102 is used to transmit the high-speed signal, and the first signal reference contact 101 is used to transmit the low-speed signal. According to another changing example of the present embodiment, a transmission frequency of the first signal H1 is greater than 1.5 Ghz, and a transmission frequency of the second signal L1 is less than 1.5 Ghz, but the present is not limited thereto. The person ordinarily skilled in the art should be able to understand the first signal transmission contact 102 that is used to transmit the high-speed signal is also can be used to transmit the low-speed signal.

In present embodiment, the electronic device 10 can be connected to a transmission cable (not illustrated) via the first transmission interface 100, and thus be connected to an external electronic device (not illustrated) via that transmission cable, in which the external electronic device may be a HDD expanding device, but is not limited thereto. Furthermore, a user can operate the electronic device 10 to transmit the first signal H1 and the second signal L1 to the external electronic device. In more detail, the user can operate the electronic device 10 and the first processing unit 160 can generate a first signal H1. The first signal H1 can be transmitted to the first signal transmission contact 102 and then to the external electronic device via the transmission cable. When the first processing unit 160 transmits the first signal H1 to the first signal transmission contact 102, the first control unit 140 controls the first switch unit 120 to connect the first signal reference contact 101 and the first ground layer 104. As a result, the first signal transmission contacts 102 can be used to transmit the first signal H1 and the first signal reference contacts 101 can be used to reduce the cross talk between the first signal transmission contacts 102 and to receive the return current of the first signal H1. Therefore, the first processing unit 160 can transmit the first signal H1 to the external electronic device via the first signal transmission contact 102. Further, the user can operate the electronic device 10 to enable the first processing unit 160 to generate a second signal L1. The second signal L1 can be transmitted to the first signal reference contact 101 and then to the external electronic device via the transmission cable. When the first processing unit 160 transmits the second signal L1 to the first signal reference contact 101, the first control unit 140 controls the first switch unit 120 to disconnect the first signal reference contact 101 from the first ground layer 104 and raises the potential of the signal reference contact 101 to a predetermined potential (high voltage level). Therefore, the first signal reference contact 101 can be used to transmit the second signal L1, and the first processing unit 160 can transmit the second signal L1 to the external electronic device via the first signal reference contact 101. In the present embodiment, the first processing unit 160 directly transmits the second signal L1 to the first signal reference contact 101, but is not limited thereto. For instance, the first control unit 140 may be coupled to the first transmission interface 100, so that the first processing unit 160 may transmit the second signal L1 to the first signal reference contact 101 via the control unit 140. In a specific embodiment, the external electronic device may have a standby function, and the second signal L1 may be an on signal, the on signal that belongs to a low-speed signal. The electronic device 10 may transmit the on signal to the external electronic device via the first signal reference contact 101, in which the external electronic device is in the standby mode and can be converted into the on mode from the standby mode by the on signal of the electronic device 10.

Furthermore, it is should be understood that, when the electronic device 10 transmits the first signal H1 via the first signal transmission contact 102, the first control unit 140 needs to control the first switch unit 120 to connect the first signal reference contact 101 with the first ground layer 104. When the electronic device 10 transmits the second signal L1 via the first signal reference contact 101, the first control unit 140 needs to control the first switch unit 120 to disconnect the first signal reference contact 101 from the first ground layer 104. As a result, the first signal transmission contact 102 and the first signal reference contact 101 cannot transmit the first signal H1 and the second signal L1 at the same time. That is, the signal transmission contact 102 and the signal reference contact 101 transmit the first signal H1 and the second signal L1 at different time point during a time span.

In the present embodiment, the first switch unit 120 may include a first end 121, a second end 122 and a third end 123, in which the first end 121 is coupled to the first signal reference contact 101 of the first transmission interface 100, the second end 122 is coupled to the first control unit 140, and the third end 123 is coupled to the first ground layer 104. When the first control unit 140 controls the first switch unit 120 to disconnect the first signal reference contact 101 from the first ground layer 104, the first end 121 and the third end 123 are floating connected. When the first control unit 140 controls the first switch unit 120 to connect the first signal reference contact 101 and the first ground layer 104, the first control unit 140 enables the second end 122 to electrically conduct the first end 121 and the third end 123. In more detail, the first switch unit 120 may include a transistor Q. A source S of the transistor Q is coupled to the first end 121, a gate G of the transistor Q is coupled to the second end 122 and a drain D of the transistor Q is coupled to the third end 123. The first control unit 140 can control the first end 121 and the third end 123 of the first switch unit 120 to floating connect or to electrically conduct. For instance, the first control unit 140 can enable the second end 122, so that a voltage potential between the gate G and the source S of the transistor Q is greater than a threshold value, and thus the source S and the drain D may conduct electricity. Since the third end 123 is connected to the first ground layer 104, the first signal reference contact 101 that is connected to the first end 121 is connected to the ground as well, so that a voltage potential of the first signal reference contact 101 is approximately equal to zero. Furthermore, when the first control unit 140 does not enable the second end 122, the first end 121 and the third end 123 are floating connected, so that the first switch unit 120 disconnects the first signal reference contact 101 from the first ground layer 104.

Figure 3:
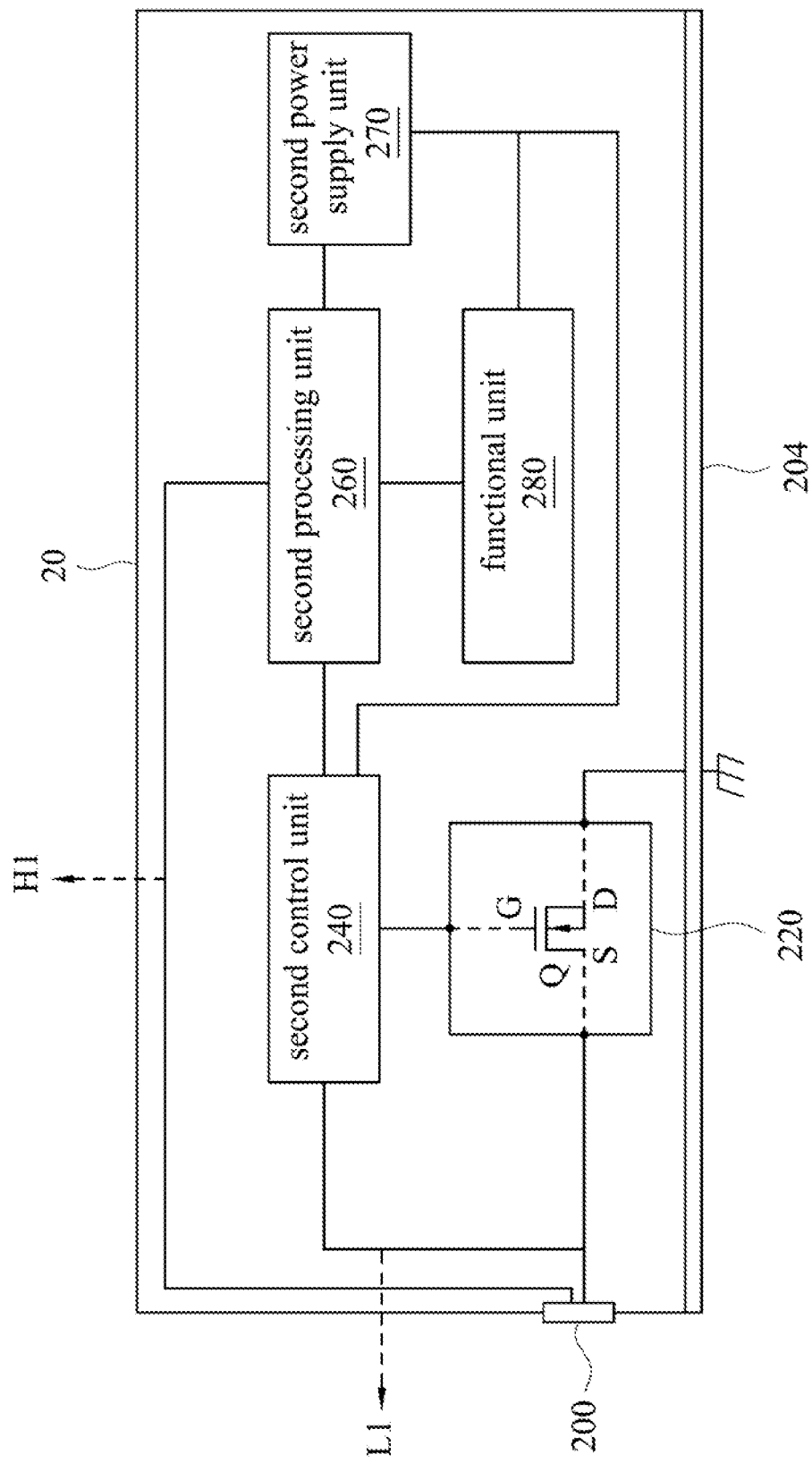
FIG. 3 illustrates a circuit block of the electronic device in accordance with another embodiment of the disclosure.
Figure 4:
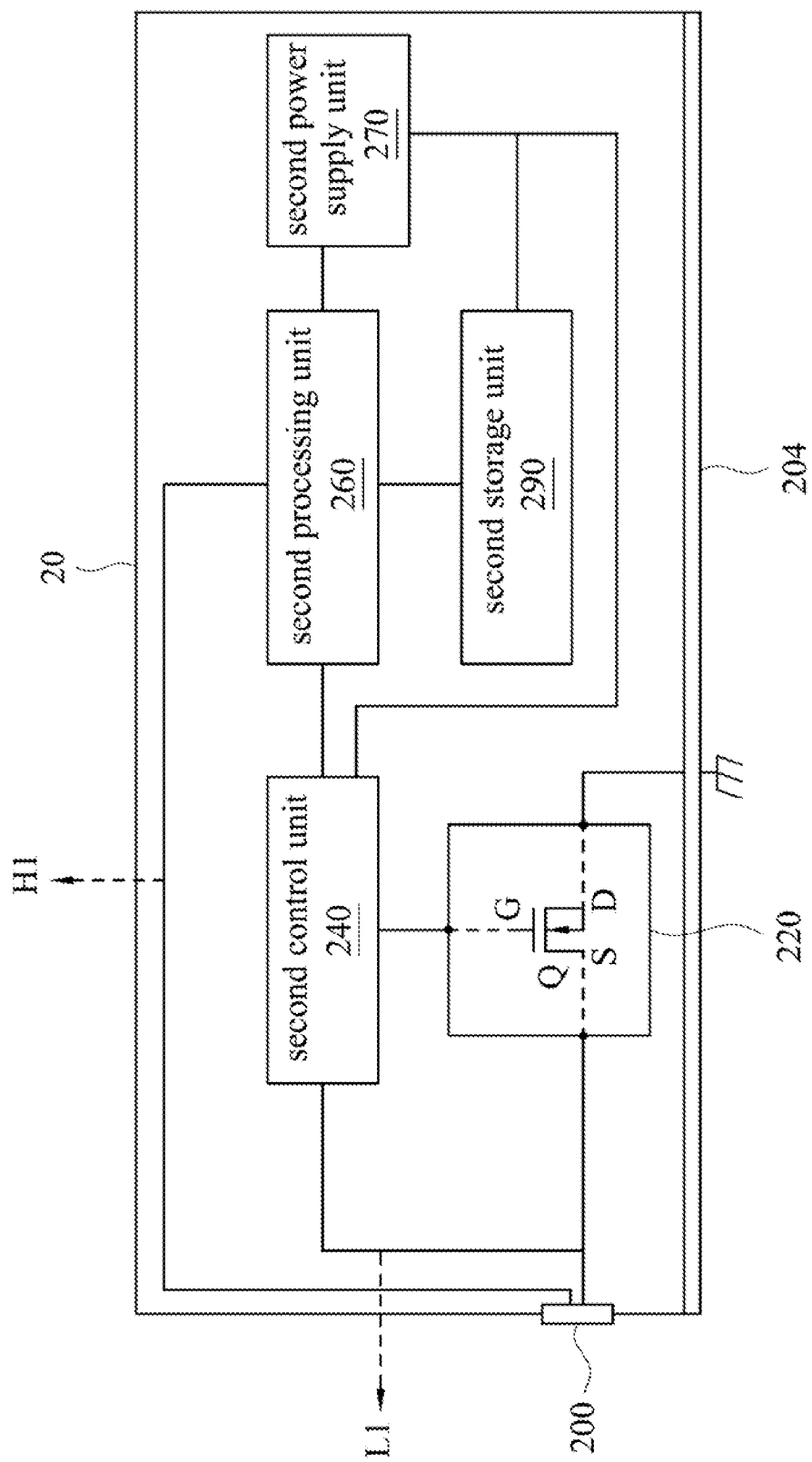
FIG. 4 illustrates a circuit block in accordance with a specific exemplary embodiment of FIG. 3.

According to FIG. 3, FIG. 3 illustrates a circuit block of the electronic device in accordance with another embodiment of the present disclosure. In the embodiment of FIG. 3, the electronic device 20 may have a standby function, and the electronic device 20 may be selectively in an on mode or a standby mode. Furthermore, the electronic device 20 may have a functional unit 280. The electronic device 20 may be able to connect to a computer or a NAS server, so as to provide an addition function to the computer or the NAS server, such as a HDD expanding function, but is not limited thereto. With reference made to FIG. 3 and FIG. 4, FIG. 4 illustrates a circuit block in accordance with a specific exemplary embodiment of FIG. 3. In the embodiment of FIG. 4, the electronic device 20 can be a HDD expanding device, so the functional unit 280 can be a second storage unit 290. As shown in FIG. 4, the electronic device 20 includes a second transmission interface 200, a second switch unit 220, a second control unit 240, a second processing unit 260, a second power supply unit 270 and the second storage unit 290.

The second storage unit 290 may be composed of any volatile media or non-volatile random-access media. For example, the second storage unit 290 can be a volatile media, a solid-state drive (SSD), a hard disk, flash memory or a combination thereof, but is not limited thereto. The second storage unit 290 can be used to store various source codes, data and files. In a specific embodiment of the present disclosure, the second storage unit 290 may be a redundant array of independent disks (RAID) that has a plurality of HDDs.

The second processing unit 260 can be a central processing unit (CPU) or a microprocessor, but is not limited thereto. The second processing unit 260 may be used to read the source codes stored in the second storage unit 290 and to execute a relative function of the source codes, so as to keep the electronic device 20 to operate normally. For instance, the second processing unit 260 may receive the first signal H1, and drive the second storage unit 290 to execute a function corresponding to the first signal H1 in response to the first signal H1. In a specific embodiment of the present disclosure, the first signal H1 may be a data accessing signal, and the second processing unit 260 may receive the data accessing signal and may access the information stored in the second storage unit 290 according to the data accessing signal.

The second transmission interface 200 includes a plurality of second signal reference contacts (not shown) and a plurality of second signal transmission contacts (not shown). In this embodiment, the second transmission interface 200 of the electronic device 20, the second switch unit 220, the second ground layer 204, the second control unit 240 and the second power supply unit 270 are similar to the first transmission interface 100 of the electronic device 10, the first switch unit 120, the first ground layer 104, the first control unit 140 and the first power supply unit 170 in FIG. 1, so the description of the same or similar parts will be omitted herein.

In general, when the second signal transmission contact transmits the first signal H1, the second signal reference contact is used to receive the return current of the first signal H1. In addition, in the present embodiment, the second signal reference contacts of the second transmission interface 200 of the electronic device 20 can be used to transmit the second signal L1. According to a changing example of the present embodiment, a transmission frequency of the second signal L1 is less than a transmission frequency of the first signal H1. For instance, the first signal H1 may be a high-speed signal, and the second signal L1 may be a low-speed signal. That is, the first signal transmission contact 102 is used to transmit the high-speed signal, and the first signal reference contact 101 is used to transmit the low-speed signal. According to another changing example of the present embodiment, a transmission frequency of the first signal H1 is greater than 1.5 Ghz, and a transmission frequency of the second signal L1 is less than 1.5 Ghz, but the present is not limited thereto.

The electronic device 20 of the present embodiment selectively uses the second signal transmission contacts to transmit the first signal H1 or uses the second signal reference contacts to transmit the second signal L1 are detail described below.

Since the electronic device 20 has a standby function, the electronic device 20 may be selectively in a standby mode or an on mode. When the electronic device 20 is in the on mode, the second control unit 240 of the electronic device 20 controls the second switch 220 to connect the second signal reference contact and the second ground layer 204. As a result, the electronic device 20 can transmit the first signal H1 via the second signal transmission contacts and the second signal reference contacts can be used to reduce the cross talk between the second signal transmission contacts. In this embodiment, the electronic device 20 may be connected to a transmission line (not shown) via the second transmission interface 200, and thus be electrically connected to an external electronic device (not shown) via the transmission line, in which the external electronic device may be a computer or a NAS server, but is not limited thereto. Furthermore, a user may operate the electronic device 20 and the second processing unit 260 may generate the first signal H1, which can be transmitted to the external electronic device via the second signal transmission contacts, but is not limited thereto. The second processing unit 260 of the electronic device 20 may also receive another first signal H1 from an external electronic device via the second signal transmission contacts and may execute a function in response to this first signal H1. For instance, this first signal H1 may be a data accessing signal, and the second processing unit 260 may receive the data accessing signal and may access the information stored in the second storage unit 290 according to the data accessing signal.

When the electronic device 20 is in the standby mode, the second power supply unit 270 of the electronic device 20 does not provide the electricity to the second processing unit 260 and the second storage unit 290. The second power supply unit 270 merely provides the electricity to the second control unit 240. In other words, when the electronic device 20 is in the standby mode, only the second control unit 240 is in an "active" state. In this case, the control unit 240 of the electronic device 20 can control the second switch unit 220 to disconnect the second signal reference contact from the second ground layer 204, and to raise the electrical potential of the second signal reference contact to a predetermined potential (high voltage level), so that the second signal reference contact can be used to transmit the second signal L1.

According to a changing example of the present embodiment, the second signal L1 may be an on signal. The electronic device 20, in the standby mode, may receive the on signal from the external electronic device via the second signal reference contact. Then, the second control unit 240 can receive the on signal from the second signal reference contact and may control the electronic device 20 to enter the on mode from the standby mode according to the on signal. In particular, the second control unit 240 can receive the on signal from the second signal reference contacts and can control the second power supply unit 270 to provide electricity to the second processing unit 260 and the second storage unit 290 according to the on signal, so that the electronic device 20 can enter the on mode. When the electronic device 20 is in the on mode, the second control unit 240 can control the second switch unit 220 to connect the second signal reference contact and the second ground layer 204, so that the second signal transmission contact can be used to transmit the first signal H1.

It is noted that, because the electronic device 20 receives the second signal (such as the on signal) by the second control unit 240 in the standby mode, the second power supply unit 270 needs to supply electricity to the second control unit 240 in the standby mode, so as to make the second control unit 240 continuously in an "active" state. In a specific embodiment, a transmission frequency of the second signal L1 is less than 1.5 Ghz. Accordingly, the second control unit 240 can be implemented by adopting a low-power consumption logic circuit or CPLD, so that the electronic device 20 is able to consume the power less that 0.5 W in the standby mode for complying with the EUP 2.0 regulation.

In summary of embodiments of FIG. 1 and FIG. 4, the electronic device 10 in FIG. 1 uses a time point that the first processing unit 160 transmits a first signal H1 to the first signal transmission contact 102 as a connection determination of the first signal reference contact 101 and the first ground layer 104, and uses a time point that the first processing unit 160 transmits a second signal L1 to the first signal reference contact 101 as a disconnection determination of the first signal reference contact 101 and the first ground layer 104. Furthermore, the electronic device 20 in FIG. 4 uses an event that the electronic device 20 is in the on mode as a connection determination of the second signal transmission contact and the second ground layer 204, and uses an event that the electronic device 20 is in the standby mode as a disconnection determination of the second signal transmission contact and the second ground layer 204.

Figure 5:
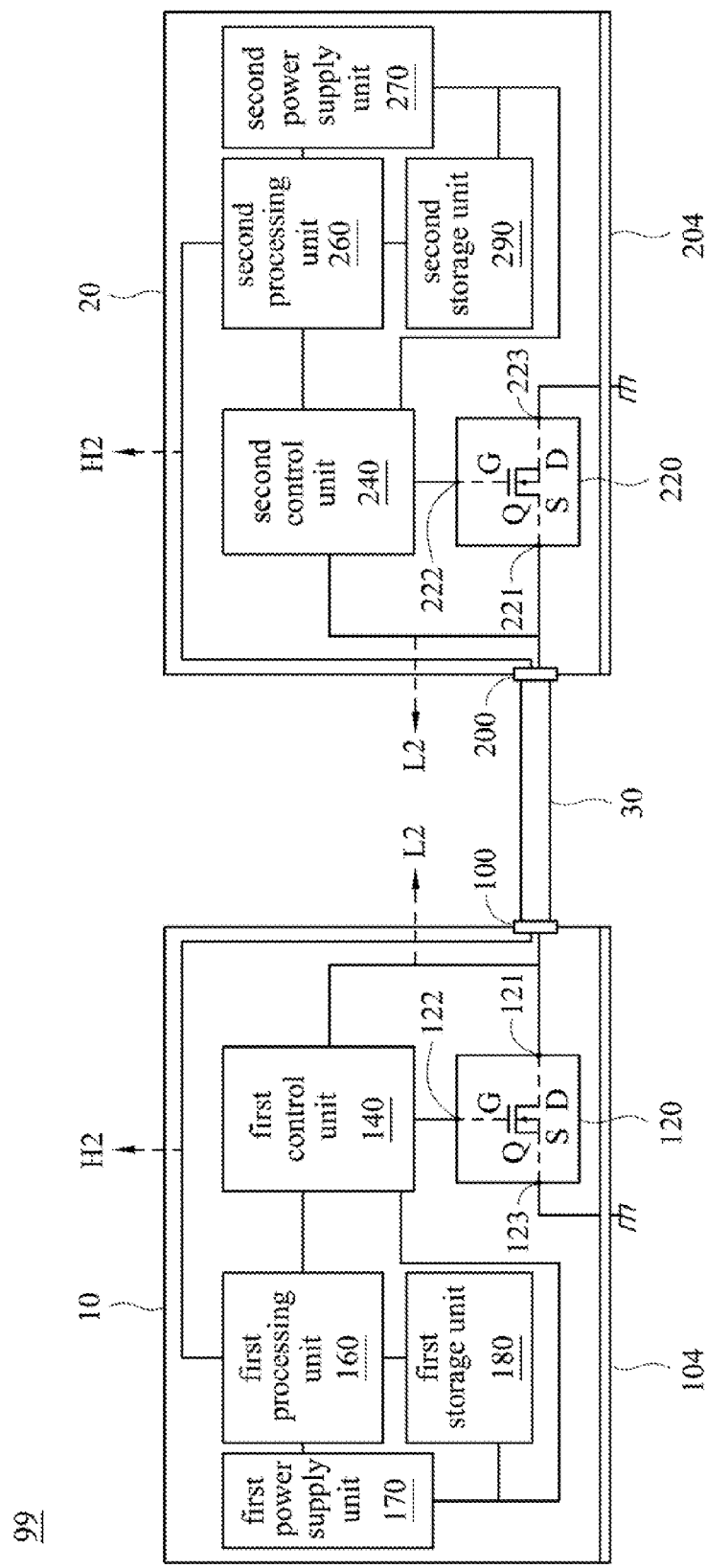
FIG. 5 illustrates a circuit block of a connection system of an electronic device in accordance with an embodiment of the disclosure.

In order to better understand how the electronic device 10 of above embodiments transmits the on signal via the first signal reference contact, and to control an external electronic device (the electronic device 20) to enter the on mode from the standby mode, and how the electronic device 20 of above embodiments receives the on signal via the second signal reference contact. Please refer to FIG. 1, FIG. 4 and FIG. 5, in which FIG. 5 illustrates a circuit block of a connection system of an electronic device in accordance with an embodiment of the present disclosure, and the electronic device connection system 99 is an example that uses the electronic device 10 in FIG. 1 to connect the electronic device 20 in FIG. 4 through the transmission line device 30. Further, in following description, as an example, the first signal H1 is a data accessing signal H2 and the second signal L1 is an on signal L2, but is not limited thereto.

As shown in FIG. 5, the electronic connection system 99 includes an electronic device 10, an electronic device 20 and a transmission line device 30. The transmission line device 30 is connected to a first transmission interface 100 of the electronic device 10 and a second transmission interface 200 of the electronic device 20. As discussed by the embodiments of FIG. 1 and FIG. 4, the first transmission interface 100 and the second transmission interface 200 can be a CX4 cable connecting port and the transmission line device 30 can be a CX4 cable, but is not limited thereto. Taking the transmission line device 30 is a CX4 cable as an example, the transmission line device 30 includes a plurality of high-speed signal wires, a plurality of signal reference layers and a sheath layer, in which two high-speed signal wires form a twisted wire pair for conducting differential signals and one of those signal reference layers is used to wrap this twisted wire pair with foil to protect neighboring wire pairs from crosstalk. Each of the signal reference layers are physically contacted and electrically connected with each other. The sheath layer can be made of an insulating material and be used to wrap the high-speed signal wires and the signal reference layers, and the high-speed signal wires and the signal reference layers can be made of a conductive material, for example copper, but is not limited thereto. When the transmission line device 30 is connected between the electronic device 10 and the electronic device 20, an end of the signal reference layer is electrically connected to the first signal reference contact 101 of the first transmission interface 100, and the other end of the signal reference layer is electrically connected to the second signal reference contact of the second transmission interface 200. Similarly, an end of the high-speed signal wire is connected to the first signal transmission contact 102 of the first transmission interface 100, and the other end of the high-speed signal wire is connected to the second signal transmission contact of the second transmission interface 200.

When the electronic device 20 is in a standby mode, the second control unit 240 of the electronic device 20 controls the second switch unit 220 to disconnect the second signal reference contact from the second ground layer 204, and raises a potential of the second signal reference contact to a predetermined potential (high voltage level), so that the second signal reference contact can be used to transmit the on signal L2. At this time, a user can operate the electronic device 10 to transmit the on signal L2 to the electronic device 20, so as to drive the electronic device 20 to enter the on mode from the standby mode. For transmitting the on signal L2 to the transmission line device 30 through the first signal reference contact 101 of the electronic device 10, the first control unit 140 of the electronic device 10 controls the first switch unit 120 to disconnect the first signal reference contact 101 from the first ground layer 104 and to raise the potential of the first signal reference contact 101 to a predetermined potential (high voltage level) when the first processing unit 160 of the electronic device 10 generates the on signal L2. Accordingly, the first processing unit 160 can transmit the on signal L2 to the first signal reference contact 101 and further to the second signal reference contact of the electronic device 20 through the signal reference layer of the transmission line device 30. Then, the second control unit 240 of the electronic device 20 can receive the on signal L2 from the second signal reference contact and control the electronic device 20 enter the on mode from the standby mode according to the on signal L2. In particularly, the second control unit 240 may receive the on signal L2 from the second signal reference contact, and control the second power supply unit 270 to provide the electricity to the second processing unit 260 and the second storage unit 290 according to the on signal L2, so that the electronic device 20 can enter the on mode from the standby mode.

After the electronic device 20 enters the on mode from the standby mode, the electronic device 20 is in the on mode and the second control unit 240 of the electronic device 20 may control the second switch unit 220 to connect the second signal reference contact and the second ground layer 204, so that the second signal transmission contact can be used to transmit the data accessing signal H2. At this time, a user may operate the electronic device 10 to transmit the data accessing signal H2 to the electronic device 20, so as to access the information stored in the second storage unit 290 of the electronic device 20. For transmitting the data accessing signal H2 to the transmission line device 30 through the first signal transmission contact 102, the first control unit 140 controls the first switch unit 120 to connect the first signal reference contact 101 and the first ground layer 104 when a user operates the electronic device 10 and enables the first processing unit 160 to generate the data accessing signal H2. Then, the first signal transmission contact 102 can be used to transmit the data accessing signal H2 and the first signal reference contact 101 can be used to reduce the cross talk between the first signal transmission contacts 102 and to receive the return current in response to the data accessing signal H2. As a result, the first processing unit 160 can transmit the data accessing signal H2 to the first signal transmission contact 102 and to the second transmission contact of the electronic device 20 via the high-speed wire of the transmission line device 30; and then the second processing unit 260 can receive the data accessing unit H2 from the second signal transmission contact and access the information stored in the second storage unit 290 according to the data accessing signal H2.

Figure 6:
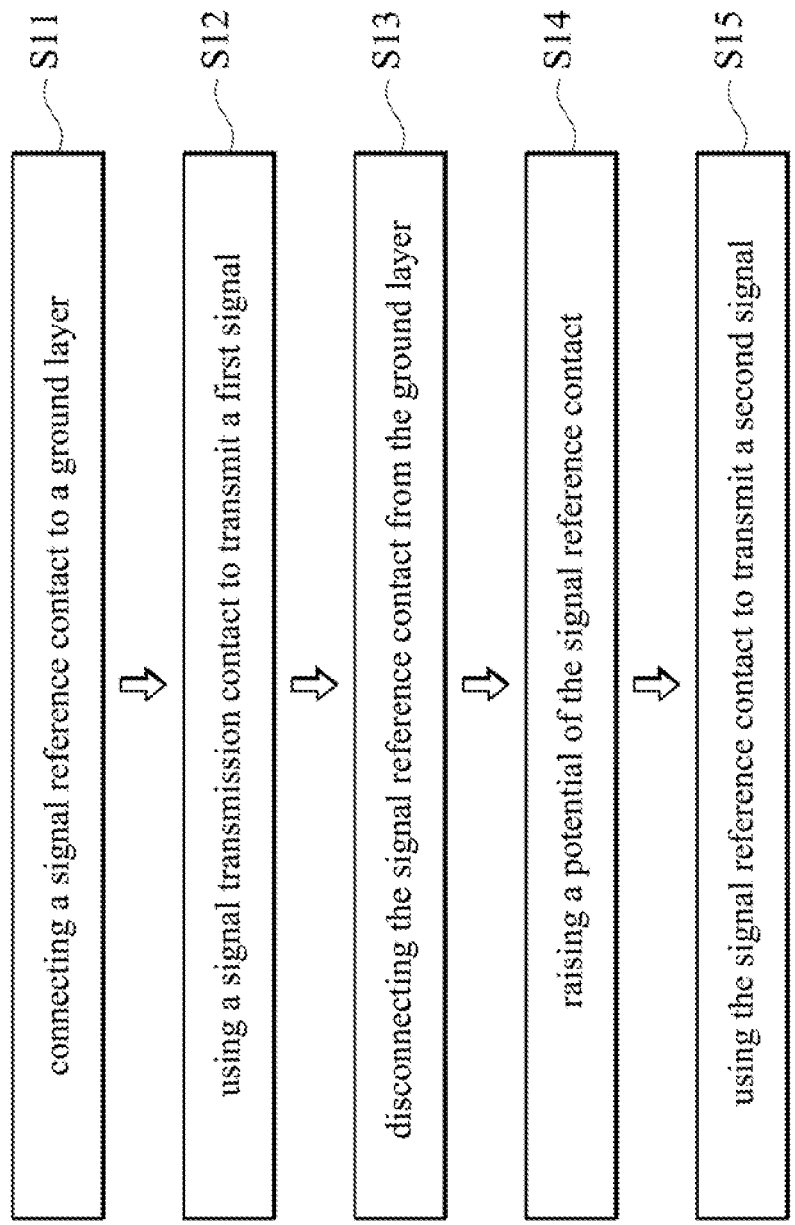
FIG. 6 illustrates a flow chart of an operation method of an electronic device in accordance with an embodiment of the disclosure.

Next, an operation method of an electronic device is disclosed below. Please refer to FIG. 6, which illustrates a flow chart of an operation method of an electronic device in accordance with an embodiment of the disclosure. This operation method can be applied to the electronic device 10 or the electronic device 20 shown in FIG. 1 through FIG. 5, but is not limited thereto. The operation method of the electronic device includes following steps: connecting a signal reference contact to a ground layer (step S11); using a signal transmission contact to transmit a first signal (step S12); disconnecting the signal reference contact from the ground layer (step S13), raising a potential of the signal reference contact (step S14); and using the signal reference contact to transmit a second signal (Step S15).

It is noted that, although an arrow is used to show a sequence from step S11 to step S15, the order of these steps is not used to limit the present invention. For example, in some embodiments, a sequence of steps S11 to S12 can be exchanged with a sequence of steps S13 to S15.

Then, the operation method of the electronic device according to an embodiment of the present disclosure will be described in detail with reference made to the electronic connection system 99 shown in FIG. 5, in which the description about the electronic device 10 and the electronic device 20 can refer to the embodiments of FIG. 1 to FIG. 4.

In present embodiment, the first control unit 140 of the electronic device 10 can control the first switch unit 120 to selectively connect or disconnect the first signal reference contact 101 and the first ground layer 104. When the first processing unit 160 of the electronic device 10 transmits a first signal H1 to the first signal transmission contact 102, the first control unit 140 controls the first switch unit 160 to connect the first signal reference contact 101 and the first ground layer 104 (step S11), so that the first signal transmission contacts 120 can be used to transmit the first signal H1 and the first signal reference contacts 101 can be used to reduce the cross talk between the signal transmission contacts 102 and to receive the return current of the first signal H1. Accordingly, the first processing unit 160 can transmit the first signal H1 to the first signal transmission contact 102 and further transmit the first signal H1 to high-speed wires inside the transmission line device 30 via the first signal transmission contact 102. At last, the first signal H1 can be transmitted to the second signal transmission contact of the electronic device 20 via the high-speed wires inside transmission line device 30.

When the first processing unit 160 of the electronic device 10 transmits a second signal L1 to the first signal reference contact 101, the first control unit 140 controls the first switch unit 160 to disconnect the first signal reference contact 101 from the first ground layer 104 (step S13) and raises a potential of the first signal reference contact 101 to a predetermined potential (step S14). As a result, the first processing unit 160 can transmit the second signal L1 to the first signal reference contact 101 and use the first signal reference contact 101 to transmit the second signal L1 to the signal reference layer of the transmission line device 30 (step S15). At last, the second signal L1 can be transmitted to the second signal reference contact of the electronic device 20 via the signal reference layer inside transmission line device 30.

Furthermore, the electronic device 20 has a standby mode function, and the electronic device 20 can selectively enter an on mode or a standby mode. When the electronic device 20 is in the on mode, the second control unit 240 of the electronic device 20 controls the second switch unit 220 to connect the second signal reference contact and the second ground layer 204 (step S11), so that the second signal transmission contact can be used to transmit the first signal H1. Accordingly, the electronic device 20 can transmit the first signal H via the second signal transmission contact (step S12). When the electronic device 20 is in the standby mode, the second control unit 240 of the electronic device 20 can control the second switch unit 220 to disconnect the second signal reference contact from the second ground layer 204 (step S13) and raise the potential of the second signal reference contact to a predetermined potential (step S14), so that the second signal reference contact can be used to transmit the second signal L1. At last, the electronic device 20 can transmit the second signal L1 via the second signal reference contact (step S15).

According to an embodiment of the present disclosure, a transmission frequency of the second signal L1 is less than a transmission frequency of the first signal H1. For instance, the first signal H1 can be a high-speed signal, and the second signal L1 can be a low-speed signal. In more detail, the first signal transmission contact 102 and the second signal transmission contact are used to transmit the high-speed signal, and the first signal reference contact 101 and the second signal reference contact are used to transmit a low-speed signal. In a changing example of the present embodiment, a transmission frequency of the second signal L1 is less than 1.5 Ghz. In practical, the second control unit 240 can be implemented by adopting a logic circuit that consumes relatively less power or CPLD, so that the power consumption of the electronic device 20 in a standby mode is less than 0.5 W, which complies with the EUP 2.0 regulation.

According to an embodiment of the present disclosure, the second signal L1 can be an on signal L2. A user can operate the electronic device 10 to transmit the on signal L2 to the electronic device 20. When the electronic device 20 is in a standby mode and the second signal reference contact receives the on signal L2, the electronic device 20 enters the on mode from the standby mode. In more detail, when the second signal reference contact of the electronic device 20 receives the on signal L2, the second control unit 240 can receive the on signal L2 via the second signal reference contact and control the second power supply unit 270 to supply electricity to the second processing unit 260 and the second storage unit 290, so that the electronic device 20 can enter the on mode from the standby mode.

As discussed above, the electronic device disclosed by above embodiments can use a signal reference contact of the transmission interface to transmit a low-speed signal (such as the on signal). When a high-speed signal needs to be transmitted, the signal reference contact is grounded so that the electronic device can transmit the high-speed signal via the signal transmission contact. As a result, when a transmission line is connected to the electronic device above, there is no need to design an additional high-speed wire inside the transmission cable to transmit the on signal, so as to avoid wasting of a high-speed wire. Furthermore, the electronic device disclosed by the above embodiments can use some simple electrical logics (such as control unit and the switch unit) to selectively connect or disconnect the signal reference contact and the ground layer. Since those simple electrical logics consume less power, so the electronic device complies with EUP 2.0 regulation in the standby mode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic device, comprising:
    a transmission interface comprising a signal reference contact and a signal transmission contact;
    a switch unit coupled between the signal reference contact and a ground layer;
    a control unit coupled to the switch unit, wherein when the control unit controls the switch unit to connect the signal reference contact to the ground layer, the signal transmission contact is used to transmit a first signal, and when the control unit controls the switch unit to disconnect the signal reference contact from the ground layer, the signal reference contact is used to transmit a second signal,
    wherein the second signal is an on signal, and a transmission frequency of the second signal is less than a transmission frequency of the first signal.

2. The electronic device of claim 1, wherein a transmission frequency of the second signal is less than 1.5 Ghz.

3. The electronic device of claim 1, wherein after the control unit controls the switch unit to disconnect the signal reference contact from the ground layer, the control unit raises an electrical potential of the signal reference contact to a predetermined potential.

4. The electronic device of claim 1, further comprising a processing unit coupled to the control unit and the transmission interface, wherein the processing unit is used to transmit the first signal and the second signal and when the processing unit transmits the second signal to the signal reference contact, the control unit controls the switch unit to disconnect the signal reference contact from the ground layer, and when processing unit transmits the first signal to the signal transmission contact, the control unit controls the switch unit to connect the signal reference contact to the ground layer.

5. The electronic device of claim 1, wherein the switch unit further comprises a first end, a second end and a third end, the first end coupled to the signal reference contact, the second end coupled to the control unit, the third end coupled to the ground layer, and when the control unit controls the switch unit to disconnect the signal reference contact from the ground layer, the first end and the third end are floating connected, when the control unit controls the switch unit to connect the signal reference contact to the ground player, the control unit enables the second end to electrically conduct the first end and the third end.

6. The electronic device of claim 1, wherein the signal transmission contact and the signal reference contact transmit the first signal and the second signal at different time point during a time span.

7. The electronic device of claim 1, wherein the electronic device has a standby function, so as to selectively enter a standby mode or an on mode, and when the electronic device is in the on mode, the control unit controls the switch unit to connect the signal reference contact to the ground layer, when the electronic device is in the standby mode, the control unit controls the switch unit to disconnect the signal reference contact from the ground layer.

8. The electronic device of claim 7, wherein when the signal reference contact of the electronic device receives the on signal in the standby mode, the control unit controls the electronic device to convert into the on mode from the standby mode according to the on signal.

9. An operation method of an electronic device, the electronic device comprising a transmission interface, the transmission interface comprising a signal reference contact and a signal transmission contact, the operation method comprising:
    connecting the signal reference contact to a ground layer;
    using the signal transmission contact to transmit a first signal;
    disconnecting the signal reference contact from the ground layer; and
    using the signal reference contact to transmit a second signal, wherein the second signal is an on signal, and a transmission frequency of the second signal is less than a transmission frequency of the first signal.

10. The operation method of the electronic device of claim 9, wherein a transmission frequency of the second signal is less than 1.5 Ghz.

11. The operation method of the electronic device of claim 9, further comprising:
    after disconnecting the signal reference contact from the ground layer, an electrical potential of the signal reference contact is raised to a predetermined potential.

12. The operation method of the electronic device of claim 9, wherein the electronic device further comprises a processing unit and the operation method further comprises:
    connecting the signal reference contact to the ground layer when the processing unit transmits the first signal to the signal transmission contact; and
    disconnecting the signal reference contact from the ground layer when the processing unit transmits the second signal to the signal reference contact.

13. The operation method of the electronic device of claim 9, wherein the electronic device has a standby function, so as to selectively enter a standby mode or an on mode, and the operation method further comprises:
    connecting the signal reference contact to the ground layer when the electronic device is in the on mode, and
    disconnecting the signal reference contact from the ground layer when the electronic device is in the standby mode.

14. The operation method of the electronic device of claim 13, wherein the operation method further comprises:
    controlling the electronic device to enter the on node from the standby mode when the signal reference contact of the electronic device receives the on signal in the standby mode.

* * * * *